United States Patent
Agahi et al.

[11] Patent Number: 6,140,208
[45] Date of Patent: Oct. 31, 2000

[54] SHALLOW TRENCH ISOLATION (STI) WITH BILAYER OF OXIDE-NITRIDE FOR VLSI APPLICATIONS

[75] Inventors: Farid Agahi, Austin, Tex.; Gary Bronner, Stormville; Bertrand Flietner, Hopewell Junction, both of N.Y.; Erwin Hammerl, Zangberg, Germany; Herbert Ho, New Windsor, N.Y.; Radhika Srinivasan, Mahwah, N.J.

[73] Assignees: International Business Machines Corporation, Armonk, N.Y.; Infineon Technologies North America Corp., San Jose, Calif.

[21] Appl. No.: 09/245,958

[22] Filed: Feb. 5, 1999

[51] Int. Cl.$^7$ .................................................. H01L 21/76
[52] U.S. Cl. .......................................... 438/437; 438/435
[58] Field of Search ................................. 438/424, 431, 438/435, 437, 439, 445, 756, 426; 134/2

[56] References Cited

U.S. PATENT DOCUMENTS

| | | | |
|---|---|---|---|
| 4,269,654 | 5/1981 | Deckert et al. | 438/756 |
| 4,631,803 | 12/1986 | Hunter et al. | 438/426 |
| 4,700,464 | 10/1987 | Okada et al. | |
| 4,952,524 | 8/1990 | Lee et al. | 438/437 |
| 5,492,858 | 2/1996 | Bose et al. | |
| 5,516,721 | 5/1996 | Galli et al. | |
| 5,604,159 | 2/1997 | Cooper et al. | |
| 5,643,823 | 7/1997 | Ho et al. | |
| 5,719,085 | 2/1998 | Moon et al. | |
| 5,763,315 | 6/1998 | Benedict et al. | 438/424 |
| 5,858,109 | 1/1999 | Hymes et al. | 134/2 |
| 5,933,749 | 8/1999 | Lee | 438/435 |

OTHER PUBLICATIONS

Wolf "Silicon Processing for the VSLI Era" Lattice Press, vol. 1, pp. 169 and 194, 1986.

*Primary Examiner*—Olik Chauduri
*Assistant Examiner*—Anh Duy Mai
*Attorney, Agent, or Firm*—Delio & Peterson, LLC; Shirley S. Ma; H. Daniel Schnurmann

[57] ABSTRACT

A reduction in parasitic leakages of shallow trench isolation vias is disclosed wherein the distance between the silicon nitride liner and the active silicon sidewalls is increased by depositing an insulating oxide layer prior to deposition of the silicon nitride liner. Preferably, the insulating oxide layer comprises tetraethylorthosilicate. The method comprises of etching one or more shallow trench isolations into a semiconductor wafer; depositing an insulating oxide layer into the trench; growing a thermal oxide in the trench; and depositing a silicon nitride liner in the trench. The thermal oxide may be grown prior to or after deposition of the insulating oxide layer.

65 Claims, 2 Drawing Sheets

SHALLOW TRENCH ISOLATION (STI) WITH BILAYER OF OXIDE-NITRIDE FOR VLSI APPLICATIONS

BACKGROUND OF THE INVENTION

1. Field of the Invention

This invention relates to the manufacture of semiconductor devices, in particular, dynamic random access memories (DRAMs) having shallow trench isolation (STI) vias for isolating the various transistors present within a capacitor array.

2. Description of Related Art

The use of silicon nitride ($Si_3N_4$) liners in shallow trench isolations (STIs) have proven to be vital for eliminating silicon defects in trench-based DRAM at 0.25 μm groundrules. With shrinking dimensions envisioned for the Gigabit generations, it is argued that a nitride liner, which can effectively block oxygen from penetrating into the trench storage capacitor, is a necessity. However, one drawback of the nitride liner presently used in the STI is its effect in trapping charge. Since the nitride liner sits close to the active silicon sidewalls, it has been shown to exacerbate (1) STI-bounded perimeter leakage, (2) node to P-well junction leakage, and most importantly, (3) buried P-channel field effect transistor (PFET) hot carrier degradation.

The proximity of the nitride liner to the active silicon sidewalls poses a serious limitation in the amount of thermal oxide that is initially grown in the STI (to heal etching-related damage). It has been observed that growing a thinner thermal oxide in the STI (i.e. less than 130 Å) is beneficial in reducing dislocation formation. Indeed, it is extremely likely that future shrinks of the array cell will require that the thickness of the initial oxide grown in the STI be reduced to prevent dislocation generation. However, the PFET device has been shown to be severely degraded if the oxide between the silicon sidewalls and the nitride liner is less than 130 Å. Thus, it is beneficial and desirable to maintain a certain distance between the silicon nitride liner and the active silicon sidewalls such that one minimizes parasitic leakages in the array and reduce PFET hot carrier degradation yet still able to block oxygen from diffusing into the trench capacitors.

U.S. Pat. No. 5,643,823 issued to Ho et al. and assigned to the assignee of the current invention discloses a crystalline silicon nitride liner in the shallow trench isolation as an oxygen barrier film. This reference, however, does not maintain a certain distance between the silicon nitride liner and the active silicon side walls such that parasitic leakages in the array are minimized in PFET hot carrier degradation.

U.S. Pat. No. 4,700,464 to Okada et al. discloses a process for forming U-shaped isolation grooves in a semiconductor body having silicon dioxide and silicon nitride films formed within the groove then filling the groove with a polycrystalline silicon topped with a silicon dioxide cap. The silicon nitride film absorbs the stresses produced by the expansion of the silicon dioxide cap preventing the development of dislocations. This reference teaches use of the silicon dioxide film to prevent short circuiting between the polycrystalline silicon in the U-grooves and the wiring formed on the surface of the substrate, or the electrodes formed in the vicinity of the wiring.

U.S. Pat. No. 5,492,858 to Bose et al. discloses the use of a silicon nitride liner conformally deposited on the thermally oxidized etched surfaces of an isolation trench. The nitride liner provides a more receptive surface than the thermal oxide coating to form a more durable bond with a later conformal dielectric filler and shields the underlying thermal oxide and or substrate from oxidation during subsequent processing. The nitride liner also serves to protect the silicon active areas from contamination during subsequent process steps since nitride is a better barrier than oxide. The reference is more precisely directed to using a silicon nitride liner to enhance subsequent processes such as planarizing the silicon substrate. It does not teach or suggest the use of the liner as a means for reducing parasitic leakages.

U.S. Pat. No. 5,516,721 to Galli et al. discloses an isolation structure using a liquid phase oxide material to fill the isolation structure. This reference does not teach nor suggest a silicon nitride liner in the isolation structure.

U.S. Pat. No. 5,604,159 to Cooper et al. discloses a method of making a contact structure or plug by etching vias into the silicon substrate. This reference does not teach nor suggest a silicon nitride liner within the contact structure to resolve the problem of parasitic leakages.

U.S. Pat. No. 5,719,085 to Moon et al. discloses a method of forming a trench isolation region by forming an opening in a semiconductor substrate, oxidizing the opening a first time and then etching the oxidized opening with a wet etch comprising hydrofluoric acid followed by oxidizing the opening a second time. This reference neither teaches nor discloses a silicon nitride liner in the shallow trench isolation structure.

Bearing in mind the problems and deficiencies of the prior art, it is therefore an object of the present invention to provide a STI via having reduced parasitic leakages.

It is another object of the present invention to provide an STI via having reduced PFET hot carrier degradation.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of forming isolations in a semiconductor body having reduced current leakage comprising the steps of:

a) providing a silicon wafer having a layer of pad oxide disposed over the wafer and a layer of pad nitride disposed over the pad oxide;

b) etching one or more shallow trench isolations into the wafer;

c) depositing an insulating oxide layer into the trench;

d) growing a thermal oxide in the trench; and e) depositing a silicon nitride liner in the trench.

Preferably, the insulating oxide layer comprises tetraethylorthosilicate or borophosphosilicate glass. Where the insulating oxide layer comprises tetraethylorthosilicate, the step of depositing a layer of tetraethylorthosilicate into the trench occurs at low pressure of about 200 mTorr to 1 Torr. The thermal oxide may be grown before or after the step of depositing an insulating oxide layer into the trench.

Preferably, the layer of pad oxide has a thickness of about 50 to 100 Å; the layer of pad nitride has a thickness of about 1200 to 2400 Å; the insulating layer comprises tetraethylorthosilicate having a thickness of about 50 to 300 Å; the thermal oxide has a thickness of about 100 Å; and the silicon nitride liner has a thickness of about 55 Å.

In another aspect, the present invention is directed to a method of reducing current leakage in an isolation trench of a semiconductor device comprising the steps of:

a) providing a silicon wafer having a dielectric layer disposed thereon;

b) etching at least one trench into the wafer;

c) depositing an insulating layer into the trench;

d) growing a thermal oxide through the insulating layer in the trench; and e) depositing a silicon nitride liner over the insulating layer and the thermal oxide.

Preferably, the insulating layer comprises tetraethylorthosilicate deposited at a low pressure of about 200 mTorr to 1 Torr having a thickness of about 50 to 300 Å. Preferably, the thermal oxide has a thickness of about 100 Å and the silicon nitride liner has a thickness of about 55 Å.

In yet another aspect, the present invention is directed to a method of reducing current leakage in an isolation trench of a semiconductor device comprising the steps of:

a) providing a silicon wafer having a dielectric layer disposed thereon;

b) etching at least one trench into the wafer;

c) growing a thermal oxide in the trench;

d) depositing an insulating layer over the thermal oxide; and e) depositing a silicon nitride liner over the insulating layer.

Preferably, the insulating layer comprises tetraethylorthosilicate deposited at a low pressure of about 200 mTorr to 1 Torr having a thickness of about 50 to 300 Å. Preferably, the thermal oxide has a thickness of about 100 Å and the silicon nitride liner has a thickness of about 55 Å. The method may further include, prior to step (e), the step of high temperature annealing the thermal oxide and the insulating layer.

In still yet another aspect, the present invention is directed to a semiconductor device comprising a semiconductor substrate having one or more electrical devices formed thereon; a plurality of shallow trench isolations formed on the substrate to isolate the electrical devices, the isolations having a thermal oxide grown in the trench; a layer of tetraethylorthosilicate over the thermal oxide; and a silicon nitride liner over the layer of tetraethylorthosilicate; and an insulative material substantially filling the trench.

In a final aspect, the present invention is directed to a semiconductor device comprising a semiconductor substrate having one or more electrical devices formed thereon; a plurality of shallow trench isolations formed on the substrate to isolate the electrical devices, the isolations having a layer of tetraethylorthosilicate deposited into the trench; a thermal oxide grown through the layer of tetraethylorthosilicate, wherein the layer of tetraethylorthosilicate and the thermal oxide are annealed at high temperature; and a silicon nitride liner deposited over the annealed layer of tetraethylorthosilicate and the thermal oxide; and an insulative material substantially filling the trench.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
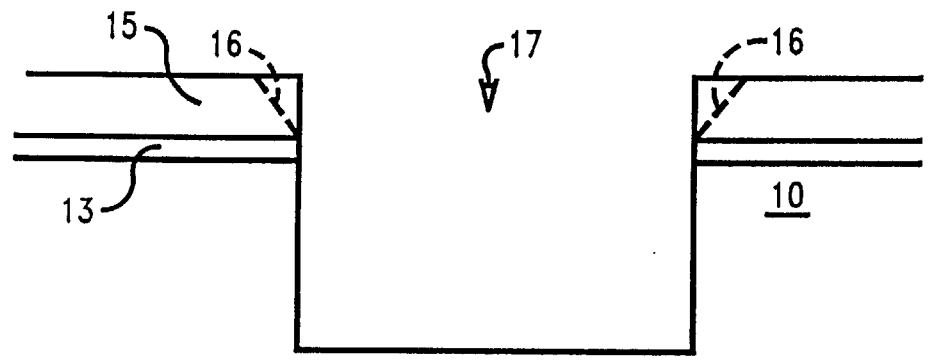
FIG. 1 is a partial vertical cross-sectional view of a semiconductor wafer having a shallow trench isolation etched into the silicon substrate.

In describing the preferred embodiment of the present invention, reference will be made herein to FIGS. 1–6 of the drawings in which like numerals refer to like features of the invention. Features of the invention are not necessarily shown to scale in the drawings.

Figure 2:
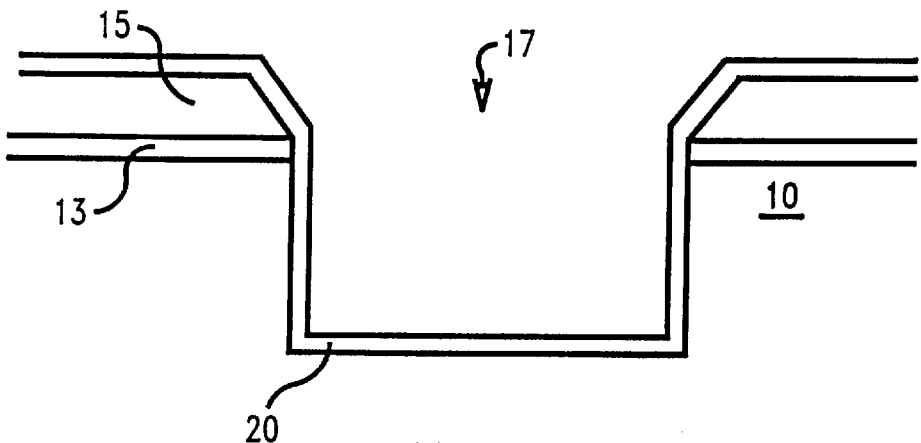
FIG. 2 is a partial vertical cross-sectional view of a semiconductor wafer having a conformal insulating layer deposited thereon.

FIGS. 1 to 4 show a first preferred embodiment of the present invention. In FIG. 1, a semiconductor substrate 10 has a pad dielectric layer deposited thereon comprising a pad oxide layer 13, preferably silicon oxide, and a pad nitride layer 15, preferably silicon nitride. The pad dielectric layer on the silicon substrate is patterned and etched according to know processes in the art, preferably a dry etch process, to form a shallow trench isolation via 17 approximately 0.25 μm deep. Pad nitride layer 15 includes portions 16 forming the upper corners adjacent to via 17. After the etching process, the isolation vias are wet cleaned using a mixture of dilute hydrofluoric acid (DHF), sulfuric peroxide, Huang A ($H_2O_2$:$NH_4OH$:$H_2O$), and Huang B ($H_2O$:$HCl$:$H_2O_2$) solutions. Following the wet clean, an HF/glycerol etch is used to remove about 20 nm of pad nitride from the side walls to partially remove or "pull back" the upper corners 16 (see FIG. 1) of pad nitride layer 15 as shown in FIG. 2. Removal of the upper corners 16 of the pad nitride layer 15 allows the isolation via to be substantially filled void-free with passivation.

After the removal of the upper corners 16 of the pad nitride layer 15, an insulating oxide layer 20 is conformally deposited, preferably sputter deposited, over the silicon substrate 10 and into trench 17. The deposition of the insulating oxide layer 20 preferably occurs at a pressure of about 20 mTorr to 1 Torr at a temperature of about 500° to 600° C. utilizing apparatus well known in the art. The thickness of insulating oxide layer 20 should ideally range from about 50 to 300 Å or of such a thickness that the insulating oxide layer 20 is conformably deposited along the side walls and bottom of the isolation via. Preferably, the insulating oxide layer comprises tetraethylorthosilicate.

Figure 3:
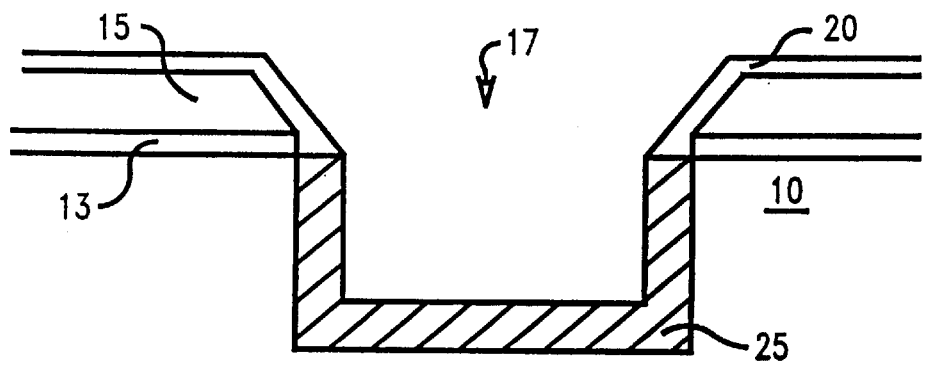
FIG. 3 is a partial vertical cross-sectional view of a semiconductor wafer having a thermal oxide grown through the deposited insulating layer.

Following the low pressure deposition of the insulating oxide layer 20, a thermal oxide is grown through the deposited insulating oxide layer 20 using a high temperature oxidation process at about 1000° C. for a period of about 1 to 10 minutes to form layer 25 as shown in FIG. 3. The thickness of the thermal oxide is tailored such that silicon crystal defects are not formed. Preferably, the thermal oxide has a thickness of about 50 to 200 Å, most preferably a thickness of about 100 Å. Incorporating about 3.0% hydrochloric acid in the ambient of the reaction chamber increases the growth rate of the thermal oxide through the deposited insulating oxide layer 20.

Figure 4:
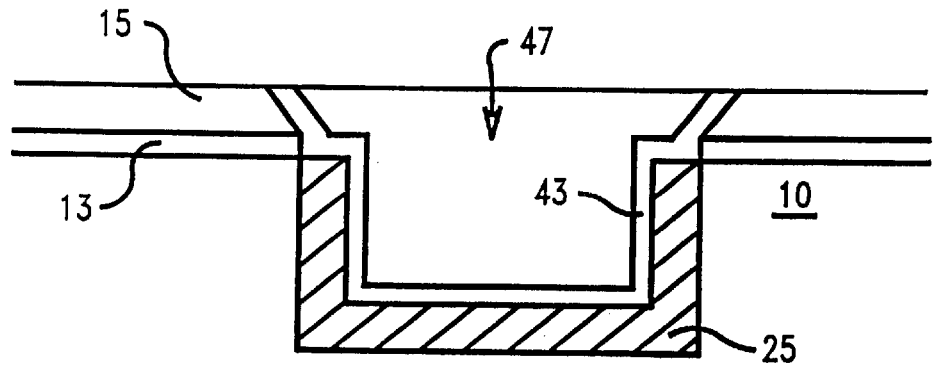
FIG. 4 is a partial vertical cross-sectional view of a semiconductor wafer having the shallow trench isolation filled with a passivation material.

In FIG. 4, the semiconductor wafer further includes a silicon nitride liner 43 deposited within the isolation via. Preferably, the silicon nitride liner has a thickness of about 55 Å. Following deposition of the silicon nitride liner 43, the isolation via is filled with passivation material 47 such as tetraethylorthosilicate. Excess passivation material 47 is removed by planarization processes known in the art such as chemical mechanical polishing. The resulting final form of the shallow trench isolation via is polished down to expose pad nitride layer 15.

Figure 5:
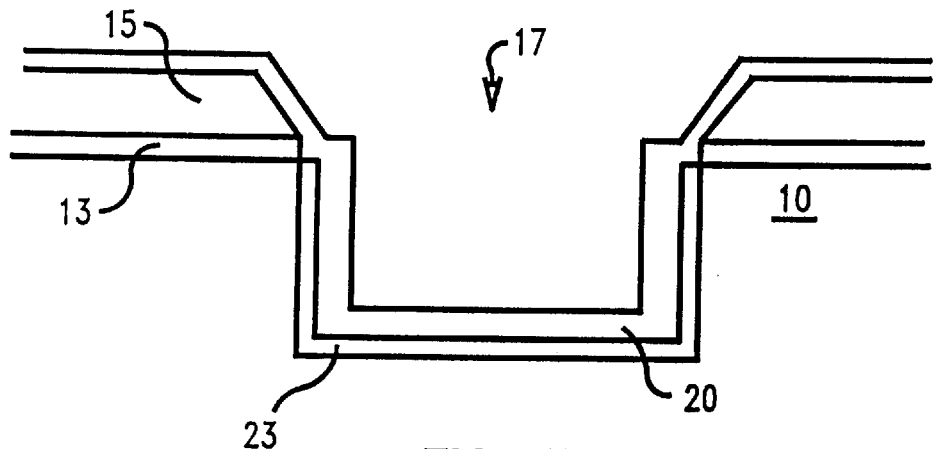
FIG. 5 is a partial vertical cross-sectional view of a semiconductor wafer according to another embodiment of the present invention wherein a thermal oxide is grown in the shallow trench isolation.
Figure 6:
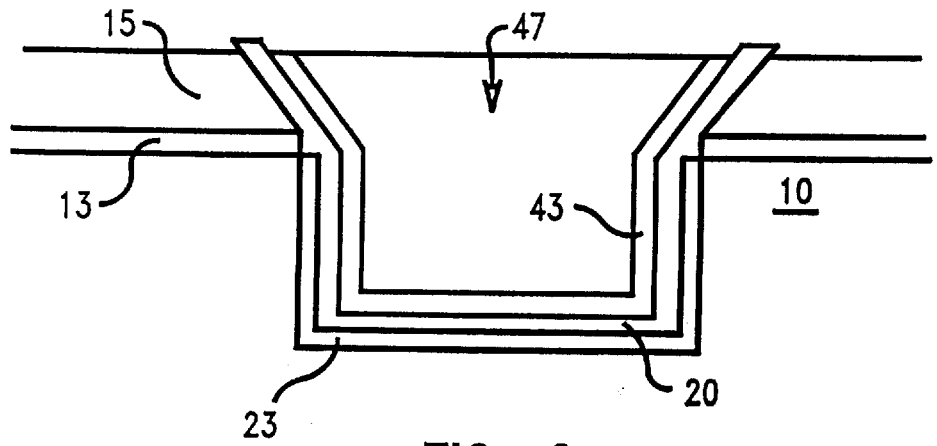
FIG. 6 is a partial vertical cross-sectional view of a semiconductor wafer having deposited therein the shallow trench isolation an insulating film and a silicon nitride liner with the shallow trench isolation filled with a passivation material.

FIGS. 5 and 6 show a second embodiment of the present invention wherein the thermal oxide layer in the shallow trench isolation via is grown prior to deposition of the insulating oxide layer. FIG. 5 depicts a portion of a semiconductor wafer having a substrate 10 and a pad dielectric comprising a pad oxide layer 13 and a pad nitride layer 15. The pad nitride layer 15, preferably, has a thickness of about 1200 to 2400 Å. The pad oxide layer 13, preferably, has a thickness of about 50 to 100 Å. The pad dielectric protects the silicon substrate 10 during formation of the shallow trench isolation. Typically the shallow trench isolation has a depth of about 0.25 $\mu$m.

Following the etching process the shallow trench isolation is wet cleaned using a mixture of DHF, sulfuric peroxide, Huang A, and Huang B solutions. Again, an HF/glycerol etch is used to remove a corner portion of the pad nitride layer 15 adjacent to trench 17 to "pull back" the pad nitride layer 15. The "pull back" of the pad nitride layer 15 allows the isolation via to be substantially filled void-free with passivation later on in processing the semiconductor wafer. After the "pull back" of the pad nitride layer 15, a thermal oxide 23 is grown in the shallow trench isolation via. The thickness of the thermal oxide should be tailored such that silicon crystal defects are avoided, preferably having a thickness of about 50 to 200 Å, most preferably, about 100 Å. High temperature dry oxidation conditions at about 1000° C. for about 1 to 10 minutes would be sufficient to grow the thermal oxide 23 in the isolation vias.

Once the thermal oxide 23 is grown in the isolation via, an insulating oxide layer 20 is conformally deposited, preferably using sputter deposition techniques, over the semiconductor wafer and into trench 17. The insulating oxide layer 20 is, preferably, tetraethylorthosilicate deposited at a low pressure of about 200 mTorr to 1 Torr at a temperature of about 500 to 600° C. The insulating oxide layer should have a thickness of about 50 to 300 Å or of such a thickness that the film is conformably deposited along the side walls and bottom of the shallow trench isolation. In order to minimize divot formation in a thin, as-deposited tetraethylorthosilicate film, a high temperature rapid thermal process may be utilized at a temperature greater than about 1000° C. with process times from about 5 seconds to 120 seconds.

In FIG. 6, the silicon nitride liner 43 is preferably deposited to a thickness of about 55 Å into the shallow trench isolation followed by filling the isolation via completely with a passivation material 47 such as tetraethylorthosilicate. Excess passivation material 47 is removed by planarization according to known methods in the art such that the pad nitride layer 15 is exposed.

There are a significant number of benefits regarding the use of the oxide-nitride bilayer in shallow trench isolation processing. First, the additional oxide layer pushes the nitride film further away from the side walls of the active silicon areas. The silicon nitride liner has a tendency to aggravate array junction leakages since it is a positively charged dielectric which sits in close proximity to the active silicon sidewalls. By adding an additional insulating oxide layer such as low pressure deposited tetraethylorthosilicate after the thermal oxidation step, it is unexpectedly found that array junction leakage is reduced by as much as eight fold. Moreover, it is found that node to p-well leakage, a major contributor to cell leakage, was reduced by as much as 20%. These results are due to a reduction in junction leakage along the STI in the trench side walls caused by the positive charges being trapped at the nitride liner.

A second advantage of having an additional insulating oxide layer as part of the isolation via liner is the added dielectric thickness above the deep trench capacitors. In some cases, the layer of passivation covering the capacitor may become thin due to erosion from deep trench and STI chemical mechanical polishing steps. This could lead to burn-in failures and, in the worst case, shorts between the wordline-trench interface. The additional insulating oxide layer tends to minimize these effects.

A further advantage is that the additional insulating oxide layer allows for the reduction of the first thermal oxidation in the shallow trench isolation via. This oxidation is the most critical in reducing the formation of dislocations as this thermal oxidation step creates the most stress in the buried straps connecting the active silicon MESA to the trench capacitor.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming isolations in a semiconductor body having reduced current leakage comprising the steps of:

(a) providing a silicon wafer having a layer of pad oxide disposed over said wafer and a layer of pad nitride disposed over said pad oxide;

(b) etching one or more shallow trench isolations into said wafer;

(c) growing a thermal oxide in said trench;

(d) depositing an insulating oxide layer over said thermal oxide;

(e) annealing said thermal oxide and said insulating oxide layer to form a densified oxide layer; and (f) depositing a silicon nitride liner in said one or more shallow trench isolations over said densified oxide layer.

2. The method of claim 1 wherein step (d) comprises sputter depositing said insulating oxide layer.

3. The method of claim 1 wherein step (d) comprises depositing a layer of tetraethylorthosilicate.

4. The method of claim 3 wherein said step of depositing a layer of tetraethylorthosilicate into said trench occurs at low pressure of about 200 mTorr to 1 Torr.

5. The method of claim 1 wherein step (d) comprises depositing a layer of borophosphosilicate glass.

6. The method of claim 1 further including after step (b) the steps of cleaning said trenches with a first hydrofluoric acid mixture;

removing a portion of said layer of pad nitride adjacent to said trench with a hydrofluoric acid/glycerol etch; and cleaning said trenches with a second hydrofluoric acid mixture.

7. The method of claim 6 wherein said step of removing a portion of said layer of pad nitride adjacent to sidewalls of said trench decreases voids in said isolations when said isolations are filled with an insulating material.

8. The method of claim 1 further including the steps of:
(f) filling said trench with a passivation material; and
(g) planarizing said wafer to remove excess of said passivation material.

9. The method of claim 1 wherein step (a) comprises providing a silicon wafer with a layer of pad oxide having a thickness of about 50 to 100 Å.

10. The method of claim 1 wherein step (a) comprises providing a silicon wafer with a layer of pad nitride having a thickness of about 1200 to 2400 Å.

11. The method of claim 1 wherein step (b) comprises etching one or more shallow trench isolations having a depth of about 0.25 $\mu$m.

12. The method of claim 1 wherein step (d) comprises depositing a layer of tetraethylorthosilicate having a thickness of about 50 to 300 Å.

13. The method of claim 1 wherein step (c) comprises growing said thermal oxide to a thickness of about 100 Å.

14. The method of claim 1 wherein step (e) comprises depositing a silicon nitride liner having a thickness of about 55 Å.

15. The method of claim 1 wherein said step of depositing said insulating oxide layer into said trench occurs at low pressure of about 200 mTorr to 1 Torr.

16. A method of reducing current leakage in an isolation trench of a semiconductor device comprising the steps of:
(a) providing a silicon wafer having a dielectric layer disposed thereon;
(b) etching at least one trench into said wafer;
(c) depositing an insulating layer into said trench;
(d) growing a thermal oxide through said insulating layer in said trench; and
(e) depositing a silicon nitride liner over said insulating layer and said thermal oxide.

17. The method of claim 16 further including the steps of:
(f) filling said trench with a passivation material; and
(g) removing excess of said passivation material.

18. The method of claim 16 wherein step (c) comprises depositing a layer of tetraethylorthosilicate at a low pressure of about 200 mTorr to 1 Torr.

19. The method of claim 18 wherein step (c) comprises depositing a layer of tetraethylorthosilicate having a thickness of about 50 to 300 Å.

20. The method of claim 18 wherein step (d) occurs at a temperature equal to or greater than 1000° C. under dry oxidation conditions in the presence of about 3.0% hydrochloric acid.

21. The method of claim 16 further including, after step (b), the steps of:
cleaning said trench with an acidic solution; and
removing a portion of said dielectric layer adjacent to said trench.

22. The method of claim 16 wherein step (d) comprises growing a thermal oxide having a thickness of about 100 Å.

23. The method of claim 16 wherein step (e) comprises depositing a silicon nitride liner having a thickness of about 55 Å.

24. A method of forming isolations in a semiconductor body having reduced current leakage comprising the steps of:
(a) providing a silicon wafer having a layer of pad oxide disposed over said wafer and a layer of pad nitride disposed over said pad oxide;
(b) etching one or more shallow trench isolations into said wafer;
(c) depositing an insulating oxide layer into said one or more shallow trench isolations;
(d) growing a thermal oxide in said trench through said insulating oxide layer; and
(e) depositing a silicon nitride liner in said one or more shallow trench isolations.

25. The method of claim 24 wherein step (c) comprises sputter depositing said insulating oxide layer.

26. The method of claim 24 wherein step (c) comprises depositing a layer of tetraethylorthosilicate.

27. The method of claim 26 wherein said step of depositing a layer of tetraethylorthosilicate occurs at low pressure of about 200 mTorr to 1 Torr.

28. The method of claim 24 wherein step (c) comprises depositing a layer of borophosphosilicate glass.

29. The method of claim 24 further including after step (b) the steps of
cleaning said one or more shallow trench isolations with a first hydrofluoric acid mixture;
removing a portion of said layer of pad nitride adjacent to said one or more shallow trench isolations with a hydrofluoric acid/glycerol etch; and
cleaning said one or more shallow trench isolations with a second hydrofluoric acid mixture.

30. The method of claim 29 wherein said step of removing a portion of said layer of pad nitride adjacent to sidewalls of said one or more shallow trench isolations decreases voids in said one or more shallow trench isolations when said one or more shallow trench isolations are filled with an insulating material.

31. The method of claim 24 further including the steps of:
(f) filling said one or more shallow trench isolations with a passivation material; and
(g) planarizing said wafer to remove excess of said passivation material.

32. The method of claim 24 wherein step (d) comprises growing said thermal oxide through said insulating oxide layer in the presence of about 3.0% hydrochloric acid at a temperature equal to or greater than 1000° C. under dry oxidation conditions.

33. A method of forming isolations in a semiconductor body having reduced current leakage comprising the steps of:
(a) providing a silicon wafer having a layer of pad oxide disposed over said wafer and a layer of pad nitride disposed over said pad oxide;
(b) etching one or more shallow trench isolations into said wafer;
(c) depositing an insulating oxide layer into said one or more shallow trench isolations at a pressure of about 200 mTorr to about 1 Torr;
(d) growing a thermal oxide in said one or more shallow trench isolations through said insulating oxide layer; and
(e) depositing a silicon nitride liner in said one or more shallow trench isolations.

34. The method of claim 33 wherein step (c) comprises sputter depositing said insulating oxide layer.

35. The method of claim 33 wherein step (c) comprises depositing a layer of tetraethylorthosilicate.

36. The method of claim 35 wherein said step of depositing a layer of tetraethylorthosilicate occurs at low pressure of about 200 mTorr to 1 Torr.

37. The method of claim 33 wherein step (c) comprises depositing a layer of borophosphosilicate glass.

38. The method of claim 33 further including after step (b) the steps of
cleaning said one or more shallow trench isolations with a first hydrofluoric acid mixture;
removing a portion of said layer of pad nitride adjacent to said one or more shallow trench isolations with a hydrofluoric acid/glycerol etch; and
cleaning said one or more shallow trench isolations with a second hydrofluoric acid mixture.

39. The method of claim 33 wherein said step of removing a portion of said layer of pad nitride adjacent to sidewalls of said one or more shallow trench isolations decreases voids in said one or more shallow trench isolations when said one or more shallow trench isolations are filled with an insulating material.

40. The method of claim 33 further including the steps of:
(f) filling said one or more shallow trench isolations with a passivation material; and
(g) planarizing said wafer to remove excess of said passivation material.

41. The method of claim 33 wherein step (d) comprises growing said thermal oxide through said insulating oxide layer in the presence of about 3.0% hydrochloric acid at a temperature equal to or greater than 1000° C. under dry oxidation conditions.

42. A method of forming isolations in a semiconductor body having reduced current leakage comprising the steps of:
(a) providing a silicon wafer having a layer of pad oxide disposed over said wafer and a layer of pad nitride disposed over said pad oxide;
(b) etching one or more shallow trench isolations into said wafer;
(c) cleaning said one or more shallow trench isolations with a first hydrofluoric acid mixture;
(d) pulling back a portion of said layer of pad nitride adjacent to sidewalls of said one or more shallow trench isolations using a hydrofluoric acid/glycerol etch;
(e) cleaning said one or more shallow trench isolations with a second hydrofluoric acid mixture;
(f) depositing an insulating oxide layer into said one or more shallow trench isolations;
(g) growing a thermal oxide in said one or more shallow trench isolations through said insulating oxide layer; and
(h) depositing a silicon nitride liner in said one or more shallow trench isolations.

43. The method of claim 42 wherein step (f) comprises sputter depositing said insulating oxide layer.

44. The method of claim 42 wherein step (f) comprises depositing a layer of tetraethylorthosilicate.

45. The method of claim 44 wherein said step of depositing a layer of tetraethylorthosilicate occurs at a pressure of about 200 mTorr to about 1 Torr.

46. The method of claim 42 wherein step (d) comprises depositing a layer of borophosphosilicate glass.

47. The method of claim 42 wherein step (d) decreases voids in said one or more shallow trench isolations when said one or more shallow trench isolations are filled with an insulating material.

48. The method of claim 42 further including the steps of:
(i) filling said one or more shallow trench isolations with a passivation material; and
(j) planarizing said wafer to remove excess of said passivation material.

49. The method of claim 42 wherein step (g) comprises growing said thermal oxide through said insulating oxide layer in the presence of about 3.0% hydrochloric acid at a temperature equal to or greater than 1000° C. under dry oxidation conditions.

50. A method of forming isolations in a semiconductor body having reduced current leakage comprising the steps of:
(a) providing a silicon wafer having a layer of pad oxide disposed over said wafer and a layer of pad nitride disposed over said pad oxide;
(b) etching one or more shallow trench isolations into said wafer;
(c) depositing an insulating oxide layer into said one or more shallow trench isolation;
(d) growing a thermal oxide in said one or more shallow trench isolation through said insulating oxide layer in the presence of about 3.0% hydrochloric acid at a temperature equal to or greater than 1000° C. under dry oxidation conditions, said thermal oxide grown to such a thickness that silicon defects are not formed on said wafer; and
(e) depositing a silicon nitride liner in said one or more shallow trench isolation.

51. The method of claim 50 wherein step (c) comprises sputter depositing said insulating oxide layer.

52. The method of claim 50 wherein step (c) comprises depositing a layer of tetraethylorthosilicate.

53. The method of claim 52 wherein said step of depositing a layer of tetraethylorthosilicate occurs at a pressure of about 200 mTorr to about 1 Torr.

54. The method of claim 50 wherein step (c) comprises depositing a layer of borophosphosilicate glass.

55. The method of claim 50 further including after step (b) the steps of
cleaning said one or more shallow trench isolations with a first hydrofluoric acid mixture;
removing a portion of said layer of pad nitride adjacent to said one or more shallow trench isolations with a hydrofluoric acid/glycerol etch; and
cleaning said one or more shallow trench isolations with a second hydrofluoric acid mixture.

56. The method of claim 55 wherein said step of removing a portion of said layer of pad nitride adjacent to said one or more shallow trench isolations decreases voids in said one or more shallow trench isolations when said one or more shallow trench isolations are filled with an insulating material.

57. The method of claim 50 further including the steps of:
(f) filling said one or more shallow trench isolations with a passivation material; and
(g) planarizing said wafer to remove excess of said passivation material.

58. A method of forming isolations in a semiconductor body having reduced current leakage comprising the steps of:

(a) providing a silicon wafer having a layer of pad oxide disposed over said wafer and a layer of pad nitride disposed over said pad oxide;

(b) etching one or more shallow trench isolations into said wafer;

(c) depositing an insulating oxide layer into said one or more shallow trench isolation;

(d) growing a thermal oxide in said one or more shallow trench isolation through said insulating oxide layer;

(e) depositing a silicon nitride liner in said one or more shallow trench isolation;

(f) filling said one or more shallow trench isolations with a passivation material; and (g) planarizing said wafer to remove excess of said passivation material.

59. The method of claim 58 wherein step (c) comprises sputter depositing said insulating oxide layer.

60. The method of claim 58 wherein step (c) comprises depositing layer of tetraethylorthosilicate.

61. The method of claim 60 wherein said step of depositing a layer of tetraethylorthosilicate occurs at a pressure of about 200 mTorr to about 1 Torr.

62. The method of claim 58 wherein step (c) comprises depositing a layer of borophosphosilicate glass.

63. The method of claim 58 further including after step (b) the steps of cleaning said one or more shallow trench isolations with a first hydrofluoric acid mixture;

removing a portion of said layer of pad nitride adjacent to said one or more shallow trench isolations with a hydrofluoric acid/glycerol etch; and cleaning said one or more shallow trench isolations with a second hydrofluoric acid mixture.

64. The method of claim 63 wherein said step of removing a portion of said layer of pad nitride adjacent to said one or more shallow trench isolations decreases voids in said one or more shallow trench isolations when said one or more shallow trench isolations are filled with an insulating material.

65. The method of claim 58 wherein step (d) comprises growing said thermal oxide through said insulating oxide layer in the presence of about 3.0% hydrochloric acid at a temperature equal to or greater than 1000° C. under dry oxidation conditions.

* * * * *

UNITED STATES PATENT AND TRADEMARK OFFICE
CERTIFICATE OF CORRECTION

PATENT NO. : 6,140,208
DATED : October 31, 2000
INVENTOR(S) : Farid Agahi et al.

It is certified that error appears in the above-identified patent and that said Letters Patent is hereby corrected as shown below:

In column 4, line 34, delete "know" and substitute therefor - - known - - .

IN THE CLAIMS

In column 6, line 65, claim 1, after "of" insert - - : - - .
In column 8, line 26, claim 29, after "of" insert - - : - - .
In column 9, line 11, claim 38, after "of" insert - - : - - .
In column 10, line 45, claim 55, after "of" insert - - : - - .
In column 11, line 20, claim 60, after "depositing" insert - - a - - .
In column 12, line 2, claim 63, after "of" insert - - : - - .

Signed and Sealed this

Twenty-second Day of May, 2001

Attest:

NICHOLAS P. GODICI

Attesting Officer     Acting Director of the United States Patent and Trademark Office